United States Patent [19]

Pathare et al.

[11] Patent Number: 4,990,490

[45] Date of Patent: Feb. 5, 1991

[54] ELECTRICAL SUPERCONDUCTING CERAMIC FIBER DEVICES

[75] Inventors: Viren M. Pathare, Shrewsbury; John W. Halloran, Hopkinton, both of Mass.

[73] Assignee: CPS Superconductor Corp., Milford, Mass.

[21] Appl. No.: 202,964

[22] Filed: Jun. 3, 1988

[51] Int. Cl.$^5$ .................. C22C 00/00; H01L 00/00
[52] U.S. Cl. .................................... 505/1; 228/179; 264/61; 29/599; 174/125.1; 505/927; 505/887
[58] Field of Search ............... 29/599; 228/179, 243, 228/190; 264/61, 62, 63, 174, 60; 427/62; 419/36, 37; 505/1, 705, 887, 927; 174/125.1; 428/389, 614, 632, 930; 106/1.18, 1.19

[56] References Cited

U.S. PATENT DOCUMENTS

| | | | |
|---|---|---|---|
| 3,074,143 | 1/1963 | Smith | 264/61 X |
| 3,450,510 | 6/1969 | Calow | 264/60 UX |
| 3,815,224 | 6/1974 | Pickus et al. | 29/599 |
| 4,044,457 | 8/1977 | Strauss et al. | 29/599 |
| 4,152,386 | 5/1979 | Winter | 505/802 X |
| 4,537,642 | 8/1985 | Saito et al. | 29/599 |
| 4,581,289 | 4/1986 | Dietrich et al. | 428/389 |
| 4,764,357 | 8/1988 | Sherif et al. | 505/1 |

FOREIGN PATENT DOCUMENTS

| | | | |
|---|---|---|---|
| 248432 | 9/1987 | European Pat. Off. | 29/599 |
| 7487 | 1/1981 | Japan | 29/599 |
| 1199549 | 7/1970 | United Kingdom | 29/599 |

OTHER PUBLICATIONS

Jin et al. "High $T_c$ Superconductors-Composite Wire Fabrication" from *Appl. Phys. Lett.* 51(3), (1987), pp. 203-204.

Alford et al. "Physical and Mechanical Properties of $YBa_2Cu_3O_7$ Superconductors" from *J. Materials Sci.*, V. 23, (1988), pp. 761-768.

Goto et al. "Preparation of High $T_c$ Superconducting Filaments by Suspension Spinning", *Japanese J. Appl. Phys.* 26(9), (1987), pp. L1527-L1528.

Meyer III et al. "Spectrascopic Evidence for Passivation of the $La_{1.85}Sr_{0.15}CuO_4$ Surface with Gold", *Applied Physics Lett.* 51(14), pp. 1118-1120.

Chien et al. "Effect of Noble Metal Buffer Layers on Superconducting $YBa_2Cu_3O_7$ Thin Films", *Appl. Phys. Lett.* 51(25), pp. 2155-2157.

Robinson "A New Route to Oxide Superconductors", *Science*, vol. 236, p. 1526 (Jun. 19, 1987).

*Primary Examiner*—Kenneth J. Ramsey
*Attorney, Agent, or Firm*—Bradley N. Ruben

[57] ABSTRACT

A coating composition for ceramic fibers is provided which includes metal particles and a vehicle. The coating can be applied to a green ceramic or a sintered ceramic, and is co-sintered or sintered therewith. Such coatings are useful for coating high temperature superconducting ceramic fibers and can be co-sintered therewith. The coated superconducting fibers, in which case the coating is porous to allow for annealing to adjust the oxygen stoichiometry, can then be sandwiched between metal cladding layers to provide a multifilamentary electrical conductor including superconducting active components. The coating is useful for such conductors because it compatibilizes the ceramic fiber with metal components, such as a solder, as well as protecting the ceramic from possibly degrading reactions. The compositions are also generally advantageous in compatibilizing ceramic fibers with a metal matrix.

6 Claims, 5 Drawing Sheets

ELECTRICAL SUPERCONDUCTING CERAMIC FIBER DEVICES

BACKGROUND OF THE INVENTION

1. Field of the Invention

The present invention provides coating compositions suitable as spin finishes for ceramic fibers and as coatings on ceramic and metal matrix-ceramic composites. More particularly, the coatings are especially suitable for compatibilizing ceramic superconducting fibers with a metal matrix, and especially as applied as a spin finish for superconducting ceramic fibers, both in the green, unfired stated and in the sintered state.

2. State of the Art

The art of spin finishes has been well-developed over the past decades, especially in the area of textile fibers. A spun fiber is typically pulled across rollers and similar devices, and it may be subjected to various treatments, before being wound onto a spool. Generally, a spin finish is applied to the as-spun fiber to reduce the friction between the fiber and the various fixed routing devices (e.g., rollers). A spin finish may also be applied to prevent fibers, once wound, from adhering to each other. Other spin finishes find importance in chemical or physiochemical treatments of the fiber. For example, a spin finish may be deposited on the fiber to improve absorption and adherence of dye in a later dying step.

On the other hand, a spin finish or other coating may be applied to a fiber to prevent reaction. For example, carbon fibers are typically provided with a coating because they readily burn. Coatings for carbon fibers are generally provided by electrodeposition. Typical coatings for carbon fibers include copper, nickel, teflon, and the like. Nickel coated carbon fibers have been used for EMI (electromagnetic interference) shielding by mixing pellets of the coated fiber with a conventional engineering plastic (a "pellet" is formed from a tow of 3,000 to 12,000 filaments which is chopped into staple lengths of about 0.25".) See, e.g., B. A. Luxon and M. V. Murthy, "Metal Coated Graphite Fibers for conductive Composites," reprinted from Proc. of the Soc. Plast. Eng. 44th Annual Technical Conference & Exhibit (1986).

The recently devised ceramic superconductors present a problem yet to be addressed. It is acknowledged in the art that a superconducting ceramic fiber, in order to function as a conductor, will have to be in intimate contact with a metal conductor in case of a quench; i.e., since the present superconducting ceramic fibers are superconducting only at reduced temperatures, in the event of a major thermal disturbance (e.g., in the situation where the refrigerant system were to fail), the entire electrical current would have to be shunted to a "normal," metallic conductor. However, ceramic-to-metal bonding is not easy to accomplish, even in metal-ceramic composites. Accordingly, to use ceramic superconductors as electrical conductors, it would be advantageous to improve the ceramic-to-metal bonding characteristics.

It is also suggested that these superconducting ceramics would be most advantageously utilized in the form of a wire. Recent investigators of the superconducting ceramics have employed a variety of techniques to produce superconducting ceramic fibers. For example, Jin et al., *Appl. Phys. Lett.*, vol. 51, no. 3, pp. 203–4 (20 July 1987), describes the production of wires by compacting finely pulverized YCBCO is $YBa_2Cu_3O_{7-x}$, also known as the "123" superconductor) powder into a metal tube and drawing the filled tube into a wire. These wires are then sintered, but this high temperature sintering depletes the YBCO of oxygen; superconducting YBCO is of a stoichiometry that is hyperoxygenated (i.e., x is less than 0.15; preferably x is less than 0.10). Accordingly, subsequent processing, further hampered by the outer metal tube, is required to readjust the stoichiometry.

Additional and related methods are described by Jin et al. in *Appl. Phys. Lett.*, vol. 51, no. 12, pp. 943–945 (21 Sep. 1988)(submitted 2 July 1987; available in the Scientific Library of the U.S. Patent and Trademark Office as of 13 Aug. 1987 under catalog number 0175). They describe melt-processing, by "drawing" or "spinning" as defined therein, of a molten pressed compact of fine YBCO powder. Again, the high temperature processing conditions result in an oxygen depletion from the necessary superconducting stoichiometry. Thus, the methods of Jin et al. are difficult to control in production, in part because the high temperature processing of YBCO previously of the desired stoichiometry necessitates a subsequent adjustment of the oxygen stoichiometry to achieve a superconducting ceramic.

Additionally, for a flux-jump stable multifilamentary conductor, the smaller the fiber diameter the more stable the conductor. A flux jump represents a local quenching of the superconductor, a collapse of the associated field, and the release of energy; a superconductor can experience its first flux jump when the stored energy of the field released into the superconductor is just sufficient to raise its temperature above $T_c$ (superconducting transition temperature). The thickness of a superconductor meters the quantity of flux associated with a jump (the liberated heat being proportional to the square of the thickness), and thus the likelihood of a flux-jumping event is reduced by decreasing the thickness (i.e., making finer filaments). See, e.g., E. W. Collins, *APPLIED SUPERCONDUCTIVITY, Metallurgy, and Physics of Titanium Alloys*, vol. 2, chpt. 25 (New York, Plenum Press: 1986).

SUMMARY OF THE INVENTION

In view of the foregoing, the present invention provides a composition useful for coating ceramics, particularly superconducting ceramics, comprising about 5–50 vol. % (±1 vol. %) of at least one of silver, gold, or a mixture or alloy thereof having a eutectic or melting temperature less than the melting point of the ceramic and/or sinterable at the sintering temperature of the ceramic, and a vehicle that adheres to the fiber. This composition is suitable as a spin finish for superconducting ceramic fibers, and for providing a metal coating layer on the fiber to improve the adhesion of the fiber to subsequently applied metal. In a particularly preferred aspect, these coatings are suitable for applying to superconducting ceramics to compatibilize same with a metallic conductor.

The present invention also provides a superconducting ceramic device which includes a plurality of superconducting ceramic fibers, each fiber having a metallization coating, the plurality of coated fibers sandwiched between layers of metal. The preferred coating is the aforementioned spin finish, which is most preferably applied to the green ceramic fiber prior to sintering.

Also provided is a process for producing the aforementioned superconducting ceramic device, which comprises the steps of (i) providing at least one superconducting ceramic fiber having a metallization coating, (ii) providing at least one composite sheet having a cladding metal outer layer and a conductive adherent inner layer, (iii) manipulating at least one composite sheet to provide generally opposing inner layers of the conductive adherent, (iv) feeding at least one ceramic fiber between the opposing layers, and (v) sandwiching the fiber(s) between the opposing layers to form an electrical conductor.

This process can be used to produce an electrical conductor comprising at least one ceramic fiber, each fiber having a metallization coating thereon, a cladding layer surrounding the at least one fiber, and a metal adherent layer therebetween. The conductor device thus produced can be fabricated in a geometry analogous to those of ribbon cables used for parallel communications interfaces; alternatively, the process can be used to produce a single superconducting ceramic fiber embedded in a metal matrix, a sort of superconducting wire within a metal wire. An advantage of this multifilament device is that connections between conductors can be simple lap joints where one sandwich overlaps another, whereby current can easily flow through the metallization, adherent, and cladding layers to the other conductor. The device also has the advantage that, as opposed to a conductor including only a single superconducting filament, a discontinuity in a filament will not result in failure of the device because the current will be carried by the other superconducting fibers (to the extent they do not reach the critical value). Still further, flux-jump stability is improved in multifilamentary conductors over monofilament conductors.

DETAILED DESCRIPTION OF SPECIFIC EMBODIMENTS

Superconducting ceramics are advantageously utilized if provided in the form of a wire or other similar conductor geometry. Processing the superconducting ceramic into such a device is hampered by, among other things, the brittle nature of ceramics and the physical incompatibility between ceramics and metals (metals do not generally wet ceramics). Still further, any device including a superconducting ceramic must provide the ceramic in the hyperoxygenated stoichiometry.

The superconducting ceramic is preferably provided in the form of a ceramic fiber. One method for producing continuous ceramic fibers is described by Pearson et al. in U.S. Pat. No. 4,071,594, which is incorporated by reference herein. Briefly, that method includes (i) providing a slip including ceramic particles, an organic solvent, and a high molecular weight linear chain polyethylene oxide polymer, (ii) forming the slip into a green thread while evaporating the solvent, and (iii) sintering the thread. A similar method, such as solution spinning, can be used to produce YBCO or LBCO ceramic fibers (in LBCO, the yttrium is substituted with lanthanum or an element from the lanthanide series (L), i.e., atomic numbers 57–71 inclusive, as used herein). A preferred method is described in the present assignee's co-pending U.S. patent application Ser. No. 193,919, filed 13 May 1988, entitled "Dry Spinning Dope for Ceramic Fibers," incorporated herein by reference. An analogous method is described by Farrow et al., in U.S. Pat. No. 4,624,812, incorporated herein by reference; they describe an injection moldable ceramic dope including a polyacetal (polyoxymethylene-based) binder, which could be tailored to provide a dope suitable for dry spinning.

Exemplary superconducting ceramic compositions include, but are not limited to, $LBa_2Cu_3O_{7-x}$ (e.g., "YBCO"), $(L_{1-x}M_x)_2CuO_4$, $MPb_{1-x}Bi_xO_3$, $La_2CuO_4$, $Bi_2M_3Cu_2O_8$ (e.g., $Bi_2CaSr_2Cu_2O_8$), $M_2YCu_3O_7$, $Tl_2M_4Cu_3O_{10}$ (e.g., $Tl_2Ba_2Ca_2Cu_3O_{10}$), and mixtures thereof, wherein $0 < x < 0.1$, L is an element having an atomic number of 57 to 71 (i.e., lanthanum or an element of the lanthanide series) or mixtures thereof and M is Ba, Sr, Ca, or mixtures thereof. As noted above, ceramics such as YBCO and the above perovskites are superconducting when the stoichiometry evidences hyperoxygenation.

A coating is applied to the superconducting ceramic; in the case where the superconducting ceramic is in the geometry of a fiber, the coating can be applied essentially as a spin finish. The coating is present to facilitate adhesion of a subsequent metal cladding or conductive layer to the superconducting ceramic. (The following discussion is directed to conductive fibers; however, it is to be understood that the present coating is applicable to various geometries and devices including superconducting ceramics, such as substrates and integrated circuit metallization.)

The metallization coating could be applied by a variety of other processes, for example, sputtering, physical vapor deposition, electroplating (e.g., in organic or aqueous baths or in molten salts), and electroless plating (in which a catalyst coating is applied and the substrate is then put into a bath where the catalyst causes the bath species to react and coat the substrate). However, such methods are expensive, reactive and/or corrosive to the fiber, and some are toxic as well as potentially explosive.

Thus, the present invention provides a method for coating a superconducting ceramic fiber with a composition that merely physically adheres to the fiber and is processed to leave only a metallization coating. The coating should be chemically compatible with both the ceramic fiber and with any subsequent metallization or cladding applied. The coating includes essentially two components: metal particles and a vehicle. In the case of applying to coating to a green ceramic fiber, the coating must also be compatible with the organic or polymeric binder in the green article. Additionally, the coating should not only wet the fiber surface, but should result in a metallization that is well-bonded to the ceramic.

The metallization (i.e., the metal in the coating composition) is preferably silver, gold, or a mixture thereof, or alloys based thereon (e.g., silver palladium alloys), having a eutectic or melting temperature less than the melting point of the ceramic. For example, YBCO has a melting point of 1010° C., and thus preferred alloys are those with eutectic points or melting points of less than that temperature. Additionally, the metal is preferably selected to be silver or gold because those metals are inert with respect to the hyperoxygenated superconducting ceramics. Further, silver is preferred because it is oxygen permeable, whereby any adjustment of the oxygen stoichiometry is not completely impaired because of a non-permeable coating.

Other metals may also be suitable, with the criterion that the (eutectic) melting point of the metal or the alloy is from about 100% to about 125% of the sintering temperature (°K) of the ceramic. Thus, for YBCO, which can be sintered at 950° C. (1223K), a suitable alloy would have a melting point of 950° C. to 1256° C. (1223K to 1529K). The metal or alloy should be chemically compatible with the ceramic and should not reduce or degrade its properties (e.g., electrochemical compatibility). Generally, then, the criteria for suitable metallization metals is that they are chemically inert with respect to the superconducting ceramic and they should melt at a temperature that is suitable for sintering the ceramic.

While the foregoing presents one set of criteria, a preferred criterion is that the metal is co-sinterable with the ceramic; that is, at the sintering temperature of the ceramic, the metal particles are below their melting point but within their sintering range. Again, the other necessary criteria are that all of the components be compatible.

In the situation where the metallization coating is applied to a green fiber, exemplary suitable vehicles include epoxy resins (as described below) and the spinning dope composition disclosed in the aforementioned U.S. application Ser. No. 193,919, the essential criteria being compatibility, with both the ceramic composition and the polymeric composition, and ease of removal, such as by evaporation and/or during binder burnout. A suitable formulation is the spinning dope as described in that co-pending application wherein the ceramic component is eliminated and the total solvent is present in an amount of about 10–50 wt. %. In the situation where the metallization is applied to a previously sintered fiber, exemplary suitable vehicles include butyl acetate as well as those just described. As previously noted, the coating should adhere to the fiber, which is primarily a function of the vehicle; accordingly, optional components of the coating may include rheology modifiers or even adhesives to promote the processing and coating of the ceramic article.

Because such coatings can be applied to a green fiber and co-sintered therewith, an alternative embodiment includes co-spinning a green fiber and a metallization coating by what is termed core-sheath spinning. In this embodiment, the core could include the superconducting ceramic (such as the dope described the present assignee's aforementioned U.S. application Ser. No. 913,919), and the sheath portion would include the metallization, and may also include a portion of the ceramic. In the case of dry spinning, it is well-known that the solids loading in the sheath should be less than that of the core to allow for solvent evolution. Nevertheless, the presence of ceramic in the sheath section along with the metallization may provide improved adhesion of the metallization and may improve the mechanical properties of the resulting fiber because of the ductile nature of the metallization. An alternative method is to melt spin a core-sheath fiber.

Preferred coating compositions include metal particles and a vehicle. The amount of metal particles is preferably between about 20 vol. % and about 60 vol. % ($\pm 1$ vol. %), the criteria being that upon removal of the vehicle, the metallization coating is about 5 to about 10 micrometers thick. As with the metallization, the essential criterion for the vehicle is inertness with respect to both the metallization and the ceramic. The coating composition can be applied to the fiber by physical applicators (e.g., brushes or swabs), by spraying (typical for spin finishes), by dipping or drawing the fiber through a bath, or by similar methods.

Various commercially available substances can be adapted for use as a coating composition. These include paints, such as SILVERPRINT, available from GC Electronics, Rockford, Ill., epoxy resins, such as EPO-TEK H205 (Part A), available from Epoxy Technology, Inc., Billerica, Mass., and colloidal solutions of protein-bound silver, such as SILVER PROTEIN, available from Aldrich Chemical Co., Milwaukee, Wis., the latter of which is used as a veterinary antiseptic (topical).

The coating or spin finish is then processed such that it coats the fiber. It has been found that this can be accomplished by heating the coated fiber to from 80% to less than 100% of the metallization melting or eutectic temperature (°K). If the metallization coating is heated to its melting point, the metallization flows so readily that it can run off of the fiber. However, if the coated fiber is heated to the point where the metallization softens, then it flows (or can easily be made to do so) around the fiber. Moreover, as a most preferred method, we have discovered that the coating can be applied to a green fiber. After the removal of the vehicle, the green composite can be co-sintered (i.e., sintering of the ceramic concurrently with sintering of the metal; while not desirous of being constrained to a particular theory, there may also be sintering of metal to ceramic), whereby the resulting article is a sintered ceramic fiber having metallization thereon. Of course, the coating can be applied to an already sintered fiber, which is subsequently heated to sinter the metal particles and thereby provide a metallization coating.

It is also important to note that the metallization coating need not be hermetic, and may be somewhat porous. For superconducting ceramics, it is advantageous that the metallization coating be porous, which allows for increased oxygen transport during adjustment of the oxygen stoichiometry.

Figure 1:
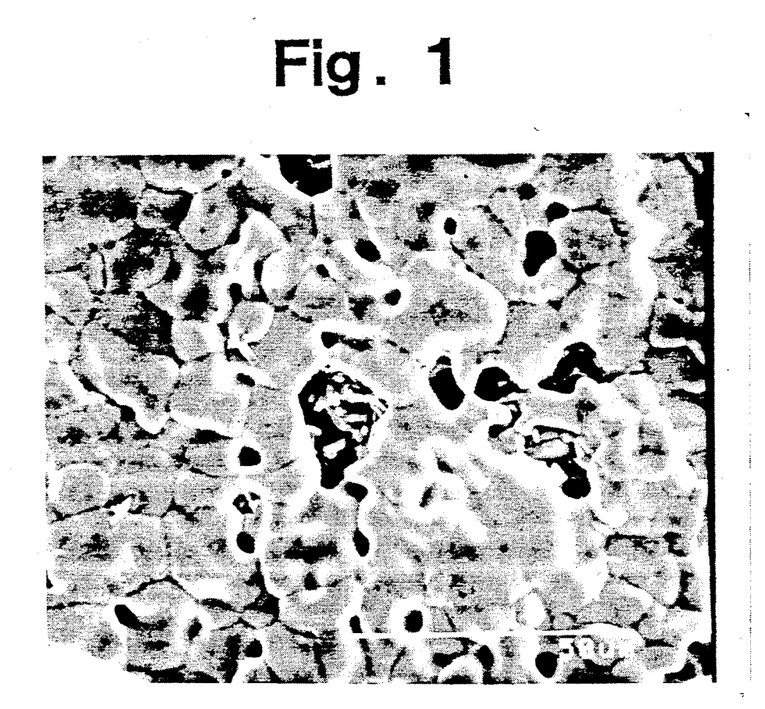
FIG. 1 is a scanning electron micrograph (SEM) of the surface of a sintered YBCO fiber onto which the present coating was applied and then sintered.

FIG. 1 depicts the surface of metallization on a sintered YBCO fiber that was coated and subsequently heated to sinter the coating. The coating is porous, which facilitates the free flow of oxygen to the ceramic, which is essential to achieving a superconducting ceramic.

Figure 2:
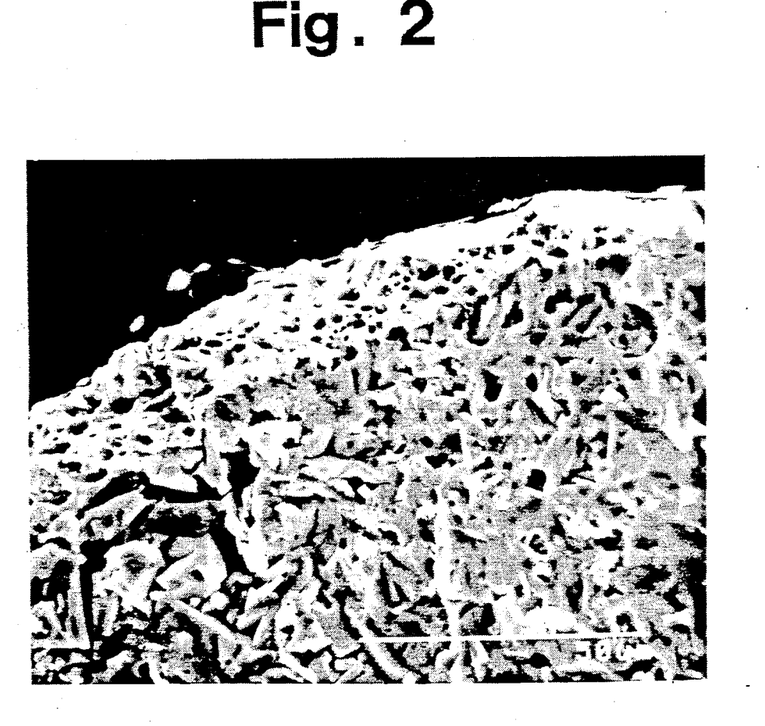
FIG. 2 is an SEM of a fracture surface of the fiber shown in FIG. 1.

FIG. 2 depicts a fracture surface the fiber in FIG. 1. The brittle cleavage fracture of the ceramic and the ductile fracture of silver are clearly shown. No delamination of the silver from the ceramic surface can be seen. Thus, the metallization is very adherent to the ceramic fiber, and the interfacial strength is greater than the individual strengths of the silver and the ceramic.

Figure 3:
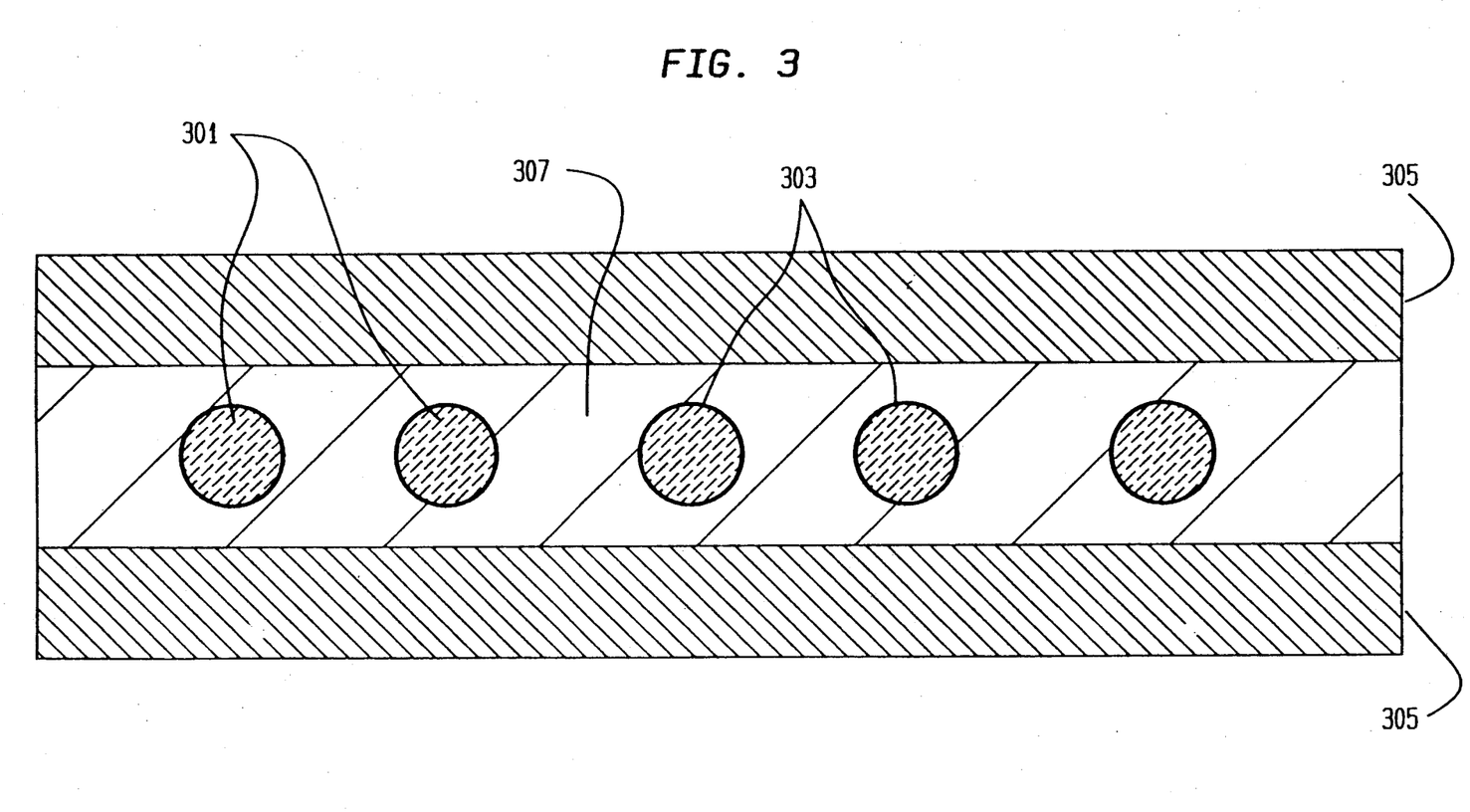
FIG. 3 depicts a superconducting electrical conductor made in accordance with the invention.
Figure 4:
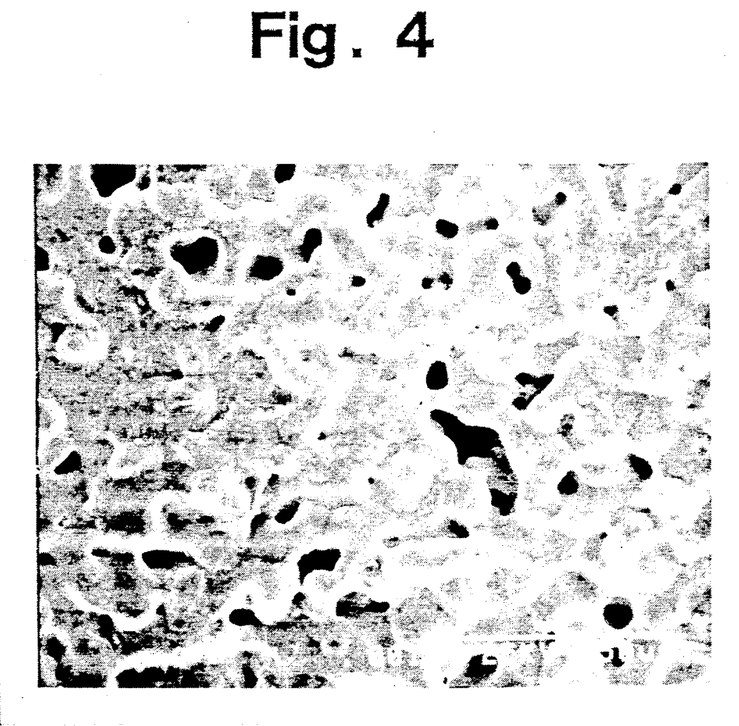
FIG. 4 is an SEM of the surface of a fiber which was coated in the green with the present coating and then co-sintered.
Figure 5:
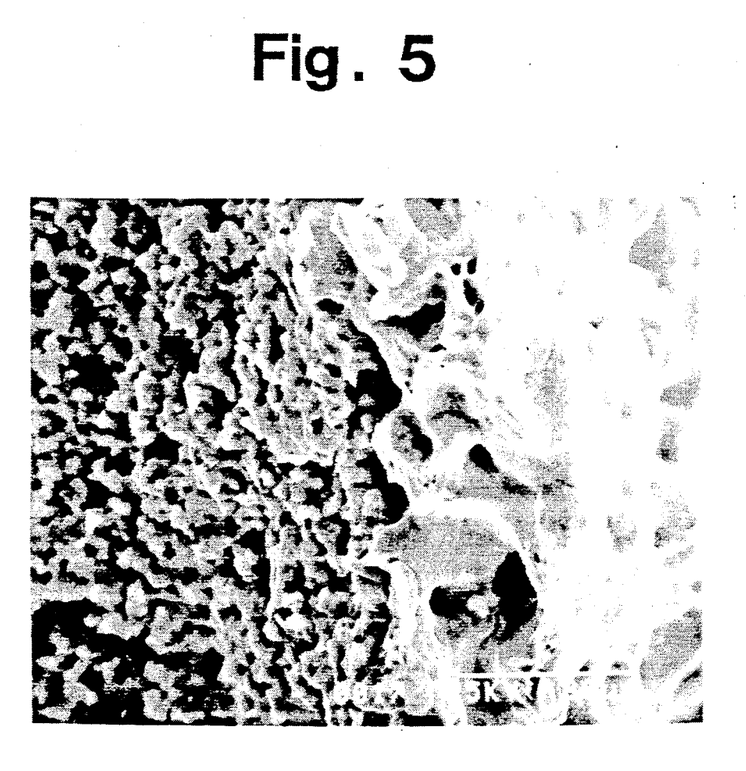
FIG. 5 is an SEM of a fracture surface of the fiber shown in FIG. 4.

FIG. 3 shows the surface resulting from a green fiber that was coated and then sintered. FIG. 4 shows a fracture surface of the same fiber. It is thus seen that both porosity and strength of the resulting metallization is sufficient regardless of whether the coating is applied to a green or a sintered fiber.

Once the coating is applied, a superconducting green ceramic YBCO fiber can be sintered at 925° C. to 950°

C., and subsequently annealed in an oxygen-containing environment to adjust the stoichiometry. Other high temperature superconducting compositions and their respective sintering parameters are described in *High Temperature Superconductors*, Mat. Res. Soc. Symp. Proc., vol. 99, Ed. by M. B. Brodsky et al. (1988).

The metallized, sintered fiber can be formed into a conducting element. By the present invention, this is accomplished by sandwiching at least one superconducting ceramic fiber within a cladding. A preferred method includes the use of the cladding in the form of a strip, the strip including a layer of solder; this is typically referred to as a presoldered strip. Because of the above described coating, a solder can be used to adhere the cladding layer to the fiber; accordingly, the solder acts as a conductive adherent. While the conductive adherent is described as existing between the cladding layers and the fibers, it is to be understood that there may be areas between fibers where opposing cladding layers are directly in contact.

An alternative method for cladding a metallized ceramic wire is by plating a thicker layer than just the metallization, such as by the methods described above. Additionally, a plurality of wires can be plated together to form a metal matrix containing a plurality of ceramic fibers embedded therein.

Typical claddings include any metal that will conduct electricity and which is mechanically suitable at the conditions under which the conductor will be used; preferred claddings include copper, gold, silver, and alloys thereof, and mixtures thereof, since, in the event of a thermal disturbance, the cladding becomes the principle current pathway.

Typical conductive adherents include low melting point metals, such as indium, tin, bismuth, and lead, and alloys thereof, such as silver-tin, silver-indium, and the like. Essentially, the conductive adherent can be any solder or braze metal alloy compatible with the superconductor and the cladding.

Thus, a composite sheet including a cladding (outer) layer and a solder (inner) layer is provided; in the final article, the cladding is the outermost layer with the solder on the inside. Such sheets are commercially available under such designations as CLAD METALS, from Polymetallurgical Corp., Attleboro Falls, Mass.

In an especially preferred embodiment, a composite sheet having a copper cladding layer and a tin-silver solder layer is provided (solder available under the designation INDALOY 132 for 95% Sn plus 5% Ag from Indium Corp., Utica, N.Y.). An opposing pair of the composite sheets are positioned such that the inner layers face each other and the ceramic fiber is mechanically sandwiched between them. Just prior to mechanical sandwiching, the solder is heated, such as by a heat lamp, resistance heater, heat gun, etc., so that it will adhere to the coated fiber. The mechanical sandwiching is of minimal force, and is performed essentially to assure that the opposing sheets are well-adhered to each other. An alternative embodiment is to provide a single composite sheet and to fold it into the desired opposing geometry as it moves through a static molding form. Thus, the final article, as shown in FIG. 3, includes superconducting ceramic fibers 301, each surrounded by a metallization layer 303, and all embedded in a metal matrix composed of two cladding sheets 305 adhered to each other and to the fibers by a resulting solder layer 307. Similarly, the fibers can be laid onto the adherent portion of one sheet over which a second sheet is then laid; the sheets are then heated to melt the solder and close up the entire inner region. Various other embodiments include an adherent layer on only one sheet (with an amount of adherent sufficient to bond opposing sheets), and using a foil whose thickness can be built up after the initial sandwiching is accomplished.

It is interesting to note that, by far, the most commonly used conductor at present is copper metal, the most reduced state of that compound. On the other hand, a ceramic such as YBCO is superconducting only when it is highly oxidized, hyperoxidized. Thus, contact between the reduced copper metal and the hyperoxidized copper containing YBCO, at the temperatures of cladding (i.e., when the solder is molten) would be disastrous; the resulting oxidation-reduction reaction would destroy the desired superconducting properties. The present invention obviates this potentially disastrous reaction by providing a metallization coating that is an inert barrier between the oxidized ceramic and the reduced cladding.

The thickness of the cladding (optionally including the solder and/or the metallization) is a design criterion determinable by one of ordinary skill in the art. Ceramic superconductors such as YBCO and LBCO are superconducting only in certain temperature regions, otherwise they are normal metallic conducting or possibly semiconducting. When superconducting, the critical current density of the ceramic, and the operating current range for a particular application, are known to the skilled artisan. A "quench" occurs when a superconductor becomes non-superconducting (e.g., in the event of a thermal disturbance), and the current must therefore be shunted to an alternate carrier. The skilled artisan can determine, by routine methods, the amount of shunt material necessary to carry the current in the event of a quench.

The composite conductor produced by this invention has a number of advantages. One benefit is that there are a plurality of fibers. Thus, a discontinuity in one ceramic fiber does not spell disaster for the conductor; the other superconductors may be able to carry the current load if the discontinuity is greater than the coherence length. A further benefit to a multifilamentary conductor is that such conductors are flux-jump stable. Another advantage of the present conductors is that they are flexible, as flexible as metallic wire, even though the active component is a brittle ceramic. Further, the conductor is essentially as small as a wire; a typical width of the conductor is from about 1-10 mm with a thickness of about 250-500 micrometers.

The conductors produced in accordance with this invention are suitable for use as the active components of electrical conductors. Accordingly, a skilled artisan would utilize the present conductors in various designs, including the further fabrication of an insulating layer (e.g., lacquer, polymeric), reinforcing layer (e.g., carbon, glass, or metal fibers), and necessary geometric requirements (e.g., depending on whether the conductor is carrying AC or DC current), and the artisan would design the appropriate refrigeration system for superconducting applications.

The present conductors provide an additional practical advantage; namely, these conductors can be easily joined by merely overlaying one conductor onto another and joining by use of a resin or adhesive having a high volume fraction (e.g., at least about 80 vol. %) of superconducting ceramic particles, or by other methods, including the use of a conducting paint or polymer, soldering, brazing, and the like. Also, if desired, the conductor can be fabricated with a large number of fibers (e.g., 100) and later split by the application of shear forces to provide conductors having a desired number of fibers (e.g., 10), including, if desired, a single ceramic fiber encased in metal. Thus, the use of shear forces easily splits the cladding layer and causes deformation in that layer, but those forces are not readily transferred to the brittle ceramic, which thus remains integral.

The foregoing descriptions and embodiments are meant to illustrate the present invention and are not meant to be limiting in any manner. Various additions, changes, or modifications may be derived by an artisan, but such are meant to be within the scope and spirit of the invention as defined by the claims.

What is claimed is:

1. A process for producing an electrical conductor, comprising the steps of:
    (i) providing at least one sintered superconducting ceramic fiber having a metallization coating sintered thereon;
    (ii) providing at least one composite sheet having a cladding metal outer layer and a conductive adherent inner layer;
    (III) manipulating at least one composite sheet to provide generally opposing inner layers of the adherent;
    (iv) feeding at least one eramic fiber between the opposing layers; and
    (v) sandwiching the fed fiber(s) between the opposing layers to form an electrical conductor.

2. The process as defined by claim 1, wherein said step (i) comprises the steps of:
    (a) providing a green superconducting ceramic fiber;
    (b) coating the green fiber with a metallization coating;
    (c) sintering the green fiber to provide a ceramic fiber having metallization thereon; and
    (d) annealing the sintered fiber in an oxygen-containing environment to adjust the stoichiometry and provide a superconducting ceramic fiber.

3. The process as defined by claim 1, wherein the ceramic is selected from the group consisting of $LM_2Cu_3O_{7-x}$, $(L_{1-x}M_x)_2CuO_4$, $Mpb_{1-x}Bi_xO_3$, $La_2CuO_4$, $Bi_2M_3Cu_2O_8$, $M_2YCu_3O_7$, $Tl_2M_4Cu_3O_{10}$, and mixtures thereof, wherein $0<x<0.1$, L is an element having an atomic number of 57 to 71 or mixtures thereof, and M is Ba, Sr, Ca, or mixtures thereof.

4. The process as defined by claim 1, wherein the metallization includes a metal selected from the group consisting of silver, gold, platinum, palladium, and mixtures and alloys thereof sinterable at the sintering temperatures of the ceramic.

5. The process as defined by claim 1, wherein the conductive adherent is a solder of a braze metal alloy.

6. The process as defined by claim 1, wherein the cladding is selected from the group consisting of copper, aluminum, silver, gold, alloys of each, and mixtures of each.

* * * * *

UNITED STATES PATENT AND TRADEMARK OFFICE
CERTIFICATE OF CORRECTION

PATENT NO. : 4,990,490

DATED : February 5, 1991

INVENTOR(S) : Viren M. Pathare and John W. Halloran

It is certified that error appears in the above-indentified patent and that said Letters Patent is hereby corrected as shown below:

Column 1, line 4, insert the following information:

"This invention was made with Government Support under Contract N00014-88-C-0512 awarded by The Department of The Navy. The Government has certain rights in the invention."

Signed and Sealed this

Twelfth Day of July, 1994

*Attest:*

BRUCE LEHMAN

*Attesting Officer*     *Commissioner of Patents and Trademarks*